US010314188B2

(12) United States Patent
Nihei

(10) Patent No.: US 10,314,188 B2
(45) Date of Patent: Jun. 4, 2019

(54) ELECTRONIC DEVICE TERMINAL PROTECTION STRUCTURE AND ELECTRONIC DEVICE

(71) Applicant: Mitsubishi Electric Corporation, Chiyoda-ku (JP)

(72) Inventor: Koichiro Nihei, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/766,232

(22) PCT Filed: Nov. 18, 2016

(86) PCT No.: PCT/JP2016/084301
§ 371 (c)(1),
(2) Date: Apr. 5, 2018

(87) PCT Pub. No.: WO2018/092276
PCT Pub. Date: May 24, 2018

(65) Prior Publication Data
US 2019/0124782 A1    Apr. 25, 2019

(51) Int. Cl.
H01R 13/44    (2006.01)
H05K 5/03    (2006.01)
(Continued)

(52) U.S. Cl.
CPC ............. H05K 5/03 (2013.01); G06F 1/16 (2013.01); H01R 13/5213 (2013.01);
(Continued)

(58) Field of Classification Search
CPC ............ H01R 13/453; H01R 13/4538
(Continued)

(56) References Cited

U.S. PATENT DOCUMENTS 8,045,323 B2 * 10/2011 Murakata ............. H05K 5/0086
361/679.01
8,934,224 B2 * 1/2015 Iwamoto ............. H01R 13/447
292/11
(Continued)

FOREIGN PATENT DOCUMENTS

JP    11-237930 A    8/1999
JP    2006-80328 A    3/2006
(Continued)

OTHER PUBLICATIONS

Office Action dated Sep. 18, 2018 in Korean Patent Application No. 10-2018-7013678 (with English translation), 10 pages.
(Continued)

Primary Examiner — Phuong K Dinh
(74) Attorney, Agent, or Firm — Oblon, McClelland, Maier & Neustadt, L.L.P.

(57) ABSTRACT

An electronic device terminal protection structure includes: a groove including a socket that exposes a connector to the outside, and a cover covering the groove. The cover includes: a cover plate having a plate shape, a hinge member provided at one end of the cover plate, a latch member, provided at the other end of the cover plate to perform a sliding operation, and a packing inserted into the socket and that abuts against a side wall of the socket when the cover is closed. The groove includes: a hinge fixing portion to which the hinge member is pivotably fixed, a barb that is engaged with the latch member, and a guide slope that leads the cover in a direction of pulling out the packing from the socket when the latch member abuts against the guide slope during a sliding operation performed in conjunction with disengagement of the latch member.

20 Claims, 10 Drawing Sheets

(51) Int. Cl.
*G06F 1/16* (2006.01)
*H01R 13/52* (2006.01)
*H01R 13/639* (2006.01)
*H05K 5/00* (2006.01)
*H01R 13/627* (2006.01)
*H04M 1/02* (2006.01)

(52) U.S. Cl.
CPC ....... *H01R 13/6271* (2013.01); *H01R 13/639* (2013.01); *H04M 1/0202* (2013.01); *H05K 5/0086* (2013.01)

(58) Field of Classification Search
USPC .......................................... 439/141, 142, 331
See application file for complete search history.

(56) References Cited

U.S. PATENT DOCUMENTS

| | | | |
|---|---|---|---|
| 9,317,077 B2* | 4/2016 | Mori | .................... G06F 1/1656 |
| 2009/0219676 A1 | 9/2009 | Murakata | |
| 2011/0199720 A1 | 8/2011 | Kajiyama et al. | |
| 2011/0255229 A1 | 10/2011 | Murakata | |
| 2013/0286569 A1 | 10/2013 | Murakata | |
| 2014/0185235 A1 | 7/2014 | Iwamoto et al. | |

FOREIGN PATENT DOCUMENTS

| | | |
|---|---|---|
| JP | 2009-5113 A | 1/2009 |
| JP | 2009-238735 A | 10/2009 |
| JP | 2011-49839 A | 3/2011 |
| JP | 2011-124465 A | 6/2011 |
| JP | 2011-190932 A | 9/2011 |
| JP | 2011-232412 A | 11/2011 |
| JP | 2014-38395 A | 2/2014 |
| JP | 2014-127677 A | 7/2014 |

OTHER PUBLICATIONS

Combined Office Action and Search Report dated Dec. 28, 2018 in Chinese Patent Application No. 201680067271.6 (with unedited computer generated English translation and English translation of categories of cited documents).

Office Action dated Jan. 18, 2019 in Korean Patent Application No. 10-2018-7013678 (with unedited computer generated English translation).

"Technological Initiatives for Waterproof and Thin Smartphones," FUJITSU 63, Sep. 5, 2012, pp. 543-547 (with English Abstract).

Japanese International Search Report dated Jan. 31, 2017 in PCT/JP2016/084301 filed Nov. 18, 2016 (with Translation of Category of Cited Documents in attached foreign language Search Report).

Japanese Office Action dated Oct. 24, 2017 in the Japanese Patent Application No. 2017-535934 (with English Translation).

* cited by examiner

ELECTRONIC DEVICE TERMINAL PROTECTION STRUCTURE AND ELECTRONIC DEVICE

CROSS-REFERENCE TO RELATED APPLICATION

This application is a United States national stage application of International Application No. PCT/JP2016/084301, filed Nov. 18, 2016, which designates the United States, and the entire contents of this international application are hereby incorporated herein by reference in entirety.

FIELD

The present invention relates to an electronic device terminal protection structure that protects a terminal of an electronic device and to an electronic device including the same.

BACKGROUND

An electronic device includes a connector into which a cable for wired communication is inserted and a slot into which a removable storage medium is inserted in order to exchange information with another device. Therefore, the housing of an electronic device includes a hole for exposing an electronic device terminal such as a connector or slot to the outside of the housing. Hereinafter, in the present specification, a hole for exposing an electronic device terminal to the outside of the housing is referred to as a "socket". Generally, the socket of an electronic device is covered and protected with a cover.

Recent electronic devices are required to be waterproof and need to prevent water from entering through the sockets. Therefore, packings are provided on covers that cover the sockets to protect the electronic device terminals. Structures for preventing water from entering through the sockets are classified into a structure called a longitudinal compression type in which a packing is placed on the front side of the opening of the socket and a structure called a transverse compression type in which a packing is put in the socket and brought into contact with the wall. The longitudinal compression type needs to secure a packing margin around the opening of the socket, and thus hinders miniaturization of the electronic device, so the adoption of the transverse compression type is progressing.

Patent Literature 1 discloses a transverse compression type waterproof structure.

CITATION LIST

Patent Literature

Patent Literature 1: Japanese Patent Application Laid-open No. 2009-5113

SUMMARY

Technical Problem

However, the transverse compression type waterproof structure has a problem: since the packing enters the socket, it is difficult to open the cover when using the connector or slot in the socket.

The present invention has been made in view of the above, and an object thereof is to obtain an electronic device terminal protection structure including a transverse compression type waterproof structure with an easy-to-open cover.

Solution to Problem

In order to solve the above-mentioned problem and achieve the object, the present invention is an electronic device terminal protection structure including: a groove including a socket that exposes an electronic device terminal to the outside; and a cover that covers the groove, and the cover includes: a cover plate having a plate shape; a hinge member provided at one end of the cover plate; a latch member, provided at the other end of the cover plate, that performs a sliding operation; and a packing arranged on the cover plate to be inserted into the socket and abut against a side wall of the socket when the cover is closed. The groove includes: a hinge fixing portion to which the hinge member is pivotably fixed; a barb that is engaged with the latch member; and a guide slope that leads the cover in a direction of pulling out the packing from the socket when the latch member abuts against the guide slope during a sliding operation performed in conjunction with disengagement of the latch member.

Advantageous Effects of Invention

The electronic device terminal protection structure according to the present invention has an effect of including a transverse compression type waterproof structure with an easy-to-open cover.

DESCRIPTION OF EMBODIMENTS

Hereinafter, an electronic device terminal protection structure and an electronic device according to embodiments of the present invention will be described in detail based on the drawings. The present invention is not limited to the embodiments.

First Embodiment

Figure 1:
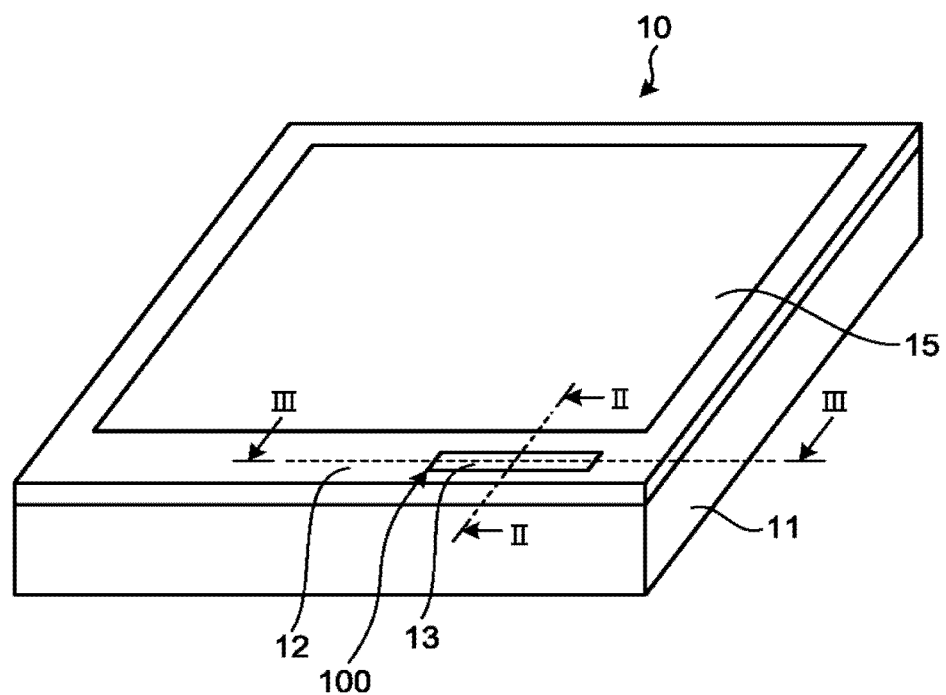
FIG. 1 is an external view illustrating an electronic device to which an electronic device terminal protection structure according to a first embodiment of the present invention is applied.
Figure 2:
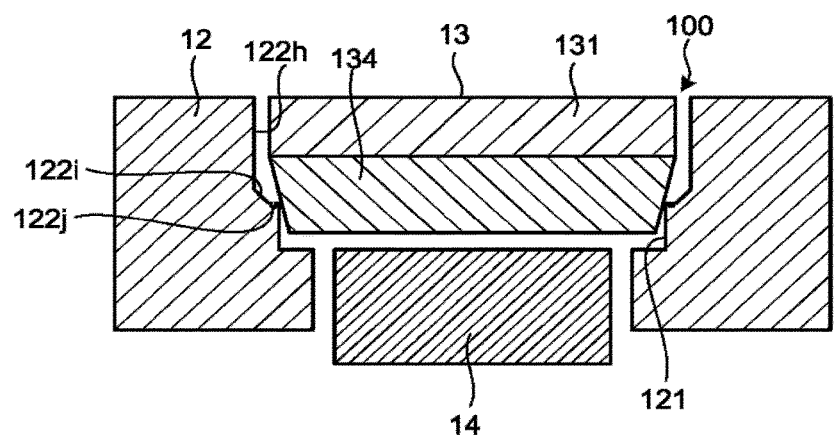
FIG. 2 is a transverse cross-sectional view taken at the electronic device terminal protection structure of the electronic device according to the first embodiment.
Figure 3:
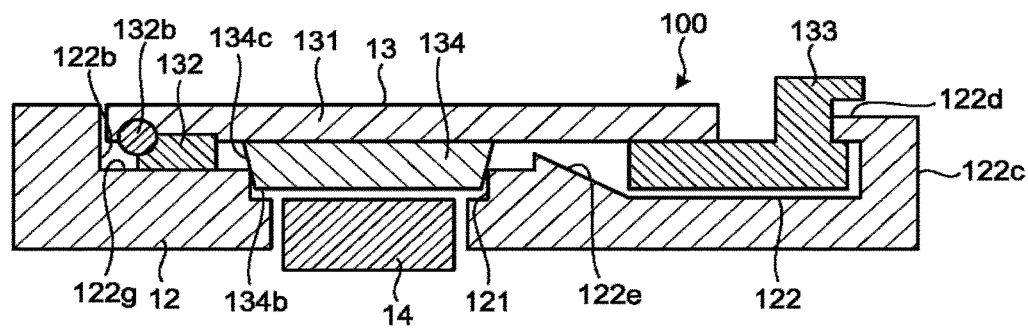
FIG. 3 is a longitudinal cross-sectional view taken at the electronic device terminal protection structure of the electronic device according to the first embodiment.

FIG. 1 is an external view illustrating an electronic device to which an electronic device terminal protection structure according to a first embodiment of the present invention is applied. FIG. 2 is a transverse cross-sectional view taken at the electronic device terminal protection structure of the electronic device according to the first embodiment. FIG. 3 is a longitudinal cross-sectional view taken at the electronic device terminal protection structure of the electronic device according to the first embodiment. The electronic device 10 is a programmable display including a display unit 15. Note that the electronic device 10 is not limited to the programmable display including the display unit 15. The electronic device 10 includes a rear case 11, a front panel 12, and a cover 13. The rear case 11 accommodates a circuit board, and the front face of the rear case 11 is open. The front panel 12 includes a socket 121 that exposes a connector 14 that is an electronic device terminal to the outside. The front panel 12 covers the front face of the rear case 11. The cover 13 protects the connector 14 arranged in the socket 121. The front panel 12 and the cover 13 constitute the electronic device terminal protection structure 100 that prevents water from entering through the socket 121. The connector 14 arranged in the socket 121 can be exemplified by, but is not limited to, a female connector of a universal serial bus (USB). As illustrated in FIG. 3, the front panel 12 includes an elongated recessed groove 122. The groove 122 includes the socket 121.

Figure 4:
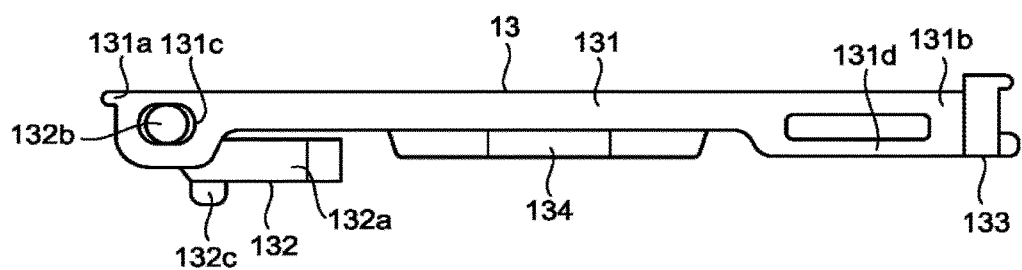
FIG. 4 is a side view illustrating a cover of the electronic device terminal protection structure according to the first embodiment.
Figure 5:
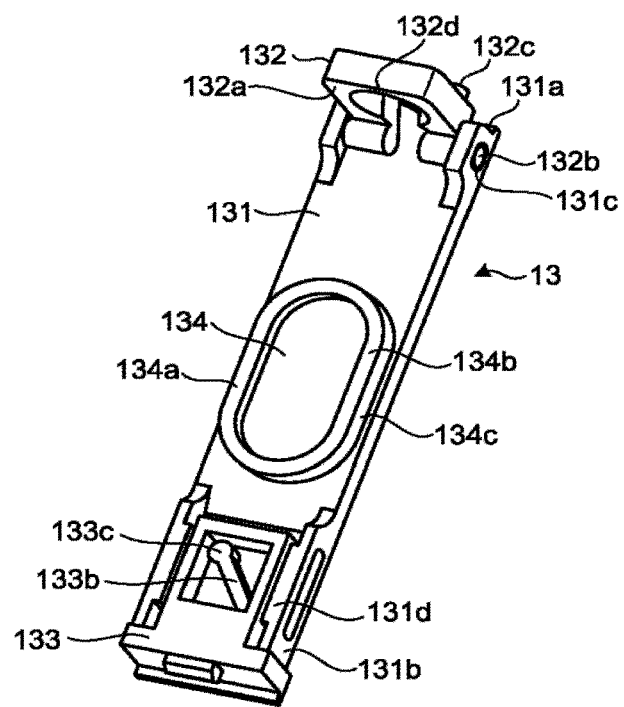
FIG. 5 is a perspective view illustrating the cover of the electronic device terminal protection structure according to the first embodiment.
Figure 6:
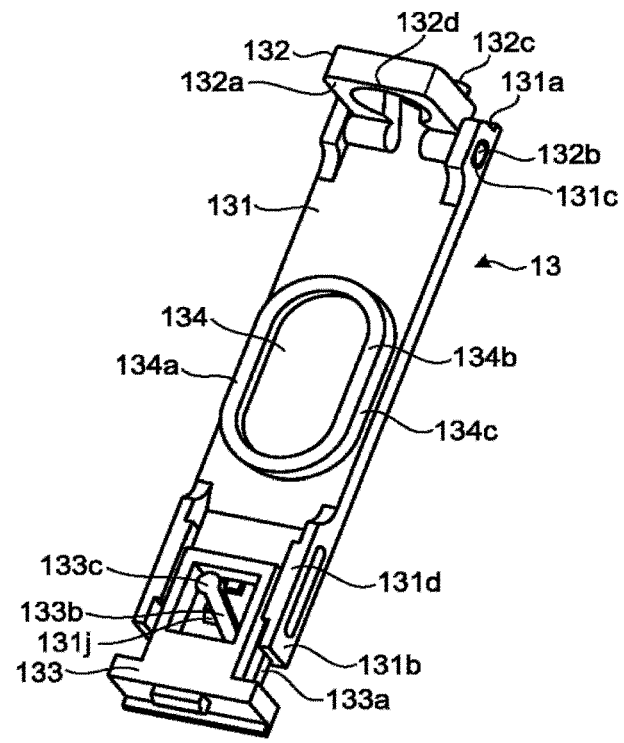
FIG. 6 is a perspective view illustrating the cover of the electronic device terminal protection structure according to the first embodiment.
Figure 7:
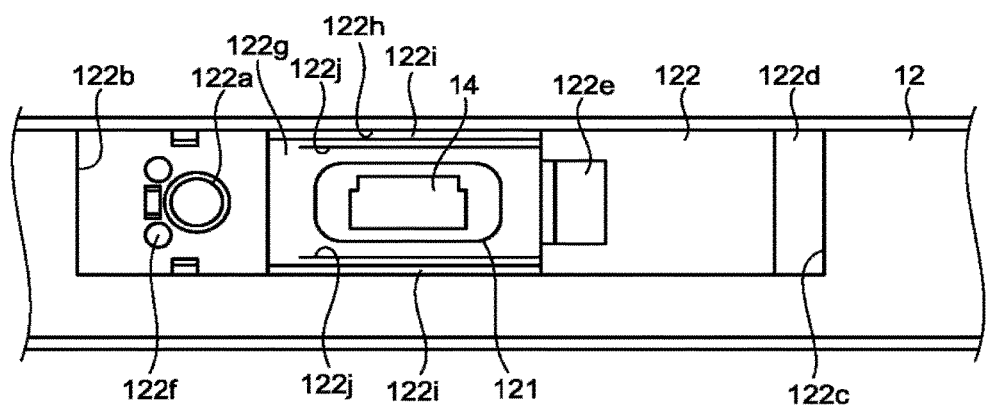
FIG. 7 is a view illustrating a groove of a front panel of the electronic device terminal protection structure according to the first embodiment.

FIG. 4 is a side view illustrating the cover of the electronic device terminal protection structure according to the first embodiment. The cover 13 includes a cover plate 131, a hinge member 132, a latch member 133, and a packing 134. The cover plate 131 has an elongated rod shape so as to be fit into the groove 122 illustrated in FIG. 3. The hinge member 132 is attached to one end 131a of the cover plate 131 in the longitudinal direction. The latch member 133 is attached to the other end 131b of the cover plate 131 in the longitudinal direction. The packing 134 is attached to an intermediate portion of the cover plate 131 in the longitudinal direction. FIGS. 5 and 6 are perspective views illustrating the cover of the electronic device terminal protection structure according to the first embodiment. The latch member 133 arranged in an unlock position (described later) is illustrated in FIGS. 4 and 5, and the latch member 133 arranged in a lock position (described later) is illustrated in FIG. 6. FIG. 7 is a view illustrating the groove of the front panel of the electronic device terminal protection structure according to the first embodiment.

The cover plate 131 includes a bearing 131c that supports the hinge member 132 at the one end 131a in the longitudinal direction, and a latch guide projection 131d that guides the latch member 133 at the other end 131b in the longitudinal direction. The shaft hole in the bearing 131c is an oval hole extending in the longitudinal direction of the cover plate 131.

The hinge member 132 includes a plate portion 132a, a shaft 132b, and a projection 132c. The plate portion 132a includes a through hole 132d formed therein. The shaft 132b protrudes from the plate portion 132a in the planar direction to pass through the shaft hole in the bearing 131c of the cover plate 131. The projection 132c is inserted into a recess 122f of the groove 122. Since the shaft hole in the bearing 131c of the cover plate 131 has an oval shape, the cover plate 131 is movably supported in the groove 122 in the longitudinal direction. The width of the plate portion 132a is smaller than the interval between the opposite parts of the bearing 131c, and the cover plate 131 is movably supported in the groove 122 along the axial direction of the shaft 132b. The hinge member 132 is fixed to the front panel 12 by engaging the projection 132c with the recess 122f of the groove 122 and screwing a screw through the through hole 132d with a screw hole 122a in a bottom face 122g of the groove 122. That is, the screw hole 122a constitutes a hinge fixing portion to which the hinge member 132 is pivotably fixed. Note that the screw hole 122a in the front panel 12 is a non-through hole. Since the screw hole 122a is a non-through hole, water does not enter the electronic device 10 through the screw hole 122a.

The latch member 133 is supported by the cover plate 131 so as to slide between the unlock position close to the one end 131a of the cover plate 131 in the longitudinal direction and the lock position away from the one end 131a of the cover plate 131 in the longitudinal direction. By providing the latch guide projection 131d for guiding on the cover plate 131 and providing a rib 133a for being guided on the latch member 133, it is possible to realize a structure for causing the latch member 133 to slide between the unlock position and the lock position. However, the structure for causing the latch member 133 to slide between the unlock position and the lock position is not limited thereto.

The cover plate 131 and the latch member 133 include a positioning mechanism that holds the latch member 133 in the unlock position when the cover 13 is being opened, and holds the latch member 133 in the lock position when the cover 13 is being closed. Details of the positioning mechanism will be described later.

The packing 134 has the same oval shape as the cross section of the socket 121, and a wall 134a is provided on the peripheral edge. The size of the oval is smaller than the size of the cross section of the socket 121 at a distal end 134b of the wall 134a and larger than the size of the cross section of the socket 121 at a root 134c of the wall 134a. In order to make sure that the oval has different sizes at the distal end 134b and the root 134c of the wall 134a, the wall 134a may be inclined to have a tapered shape as a whole, or the wall 134a may be chamfered. When the cover 13 is closed, the packing 134 is inserted into the socket 121 and abuts against the side wall of the socket 121.

As illustrated in FIG. 7, the screw hole 122a and the recess 122f are provided at one end 122b of the groove 122 of the front panel 12, and a barb 122d having such a shape as to be engaged with the latch member 133 arranged in the lock position is provided at the other end 122c opposite to the one end 122b. The groove 122 is shallow at the one end 122b and deep at the other end 122c, and a guide slope 122e is formed at the intermediate portion. In response to the latch member 133 being arranged in the unlock position with the cover 13 closed, the guide slope 122e urges the latch member 133 in the direction of pulling out the packing 134 from the socket 121. When the cover 13 is being closed, the guide slope 122e abuts against the latch member 133 to lead the latch member 133 to the lock position. The socket 121 is provided closer to the one end 122b than the guide slope 122e is.

The groove 122 also includes a slope 122i extending across the bottom face 122g and a side face 122h, making it difficult for water to stay in the vicinity of the socket 121, whereby water hardly enters the socket 121. Note that the same effect can be obtained by the slope 122i including a rounded face. The bottom face 122g of the groove 122 also includes a drain groove 122j that guides water that has entered the groove 122 from the vicinity of the socket 121 toward the other end 122c, making it difficult for water to stay in the vicinity of the socket 121, whereby water hardly enters the socket 121.

Figure 8:
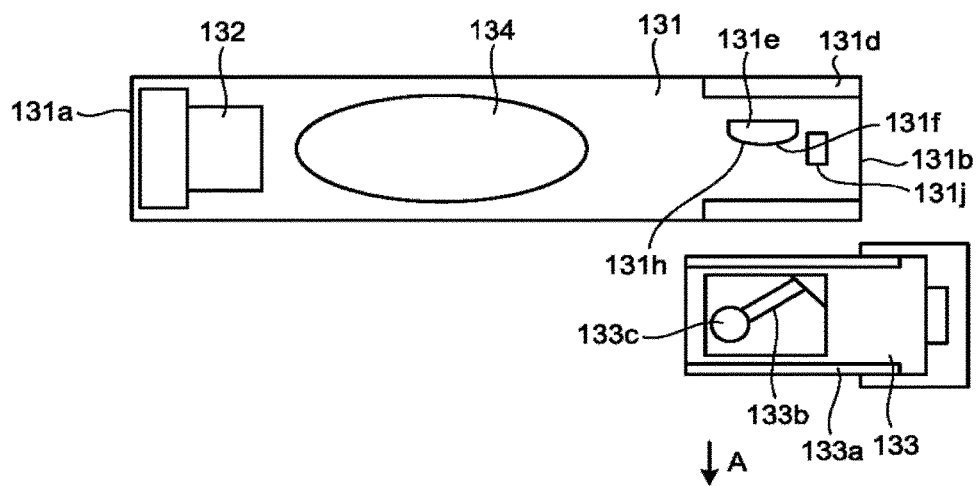
FIG. 8 is a view illustrating a positioning mechanism of the cover of the electronic device terminal protection structure according to the first embodiment, with a latch member removed from a cover plate.

FIG. 8 is a view illustrating the positioning mechanism of the cover of the electronic device terminal protection structure according to the first embodiment, with the latch member removed from the cover plate. The positioning mechanism includes a projection 131e formed on the cover plate 131 and a spring 133b formed on the latch member 133. The projection 131e includes a curved face 131h whose intermediate portion in the longitudinal direction of the cover plate 131 is convex. The spring 133b is in the shape of a rod elastically deformable on a plane parallel to the cover plate 131. With the latch member 133 attached to the cover plate 131, the spring 133b abuts against the curved face 131h of the projection 131e while the spring 133b is bent in the convex direction of the curved face 131h, that is, in the direction of arrow A in FIG. 8. A distal end 133c of the spring 133b abuts against the curved face 131h from the side close to the one end 131a, so that the latch member 133 is held in the unlock position. The distal end 133c of the spring 133b abuts against the curved face 131h from the side close to the other end 131b, so that the latch member 133 is held in the lock position. When the latch member 133 is positioned between the lock position and the unlock position, the distal end 133c of the spring 133b is guided by the curved face 131h of the projection 131e, so that the latch member 133 is led to the lock position or the unlock position. The cover plate 131 includes a retaining projection 131j. The retaining projection 131j includes a slope on the side close to the other end 131b and a vertical face on the side close to the one end 131a. Therefore, when assembling the latch member 133 and the cover plate 131, the distal end 133c of the spring 133b can get over the retaining projection 131j along the slope. After assembling, the distal end 133c of the spring 133b is in contact with the vertical face, so that the latch member 133 and the cover plate 131 are not easily separated from each other. Note that the structure for preventing the latch member 133 and the cover plate 131 from being separated from each other is not limited to the above structure.

Figure 9:
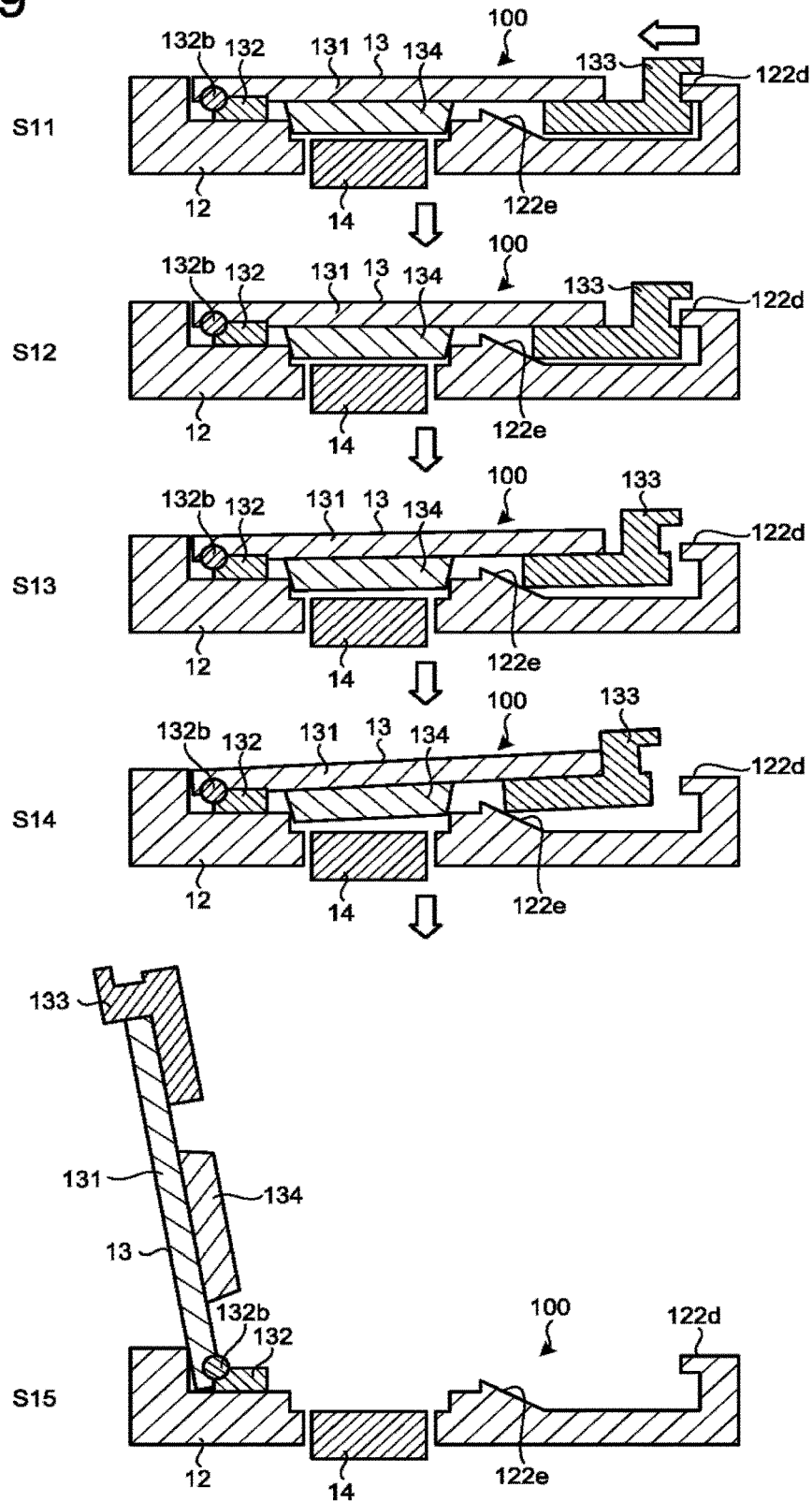
FIG. 9 is a view illustrating state changes that occur when the cover of the electronic device terminal protection structure according to the first embodiment is being opened.

The operation for opening the cover 13 will be described. FIG. 9 is a view illustrating state changes that occur when the cover of the electronic device terminal protection structure according to the first embodiment is being opened. As illustrated in stage S11, while the cover 13 is closed, the latch member 133 is arranged in the lock position by the positioning mechanism, and the latch member 133 is engaged with the barb 122d. As illustrated in stage S12, when the latch member 133 is slid toward the unlock position, the latch member 133 is disengaged from the barb 122d. As illustrated in stage S13, when the latch member 133 is further slid toward the unlock position, the latch member 133 gets on the guide slope 122e and slides up and climbs the guide slope 122e. As illustrated in stage S14, as the latch member 133 climbs the guide slope 122e, the cover plate 131 pivots on the shaft 132b of the hinge member 132 in the direction away from the socket 121, and the packing 134 is pulled out from the socket 121. The distal end 133c of the spring 133b moves from the position where it abuts against the projection 131e from the side close to the other end 131b to the position where it abuts against the projection 131e from the side close to the one end 131a, and the latch member 133 is led to and held in the unlock position. As illustrated in stage S15, after the packing 134 is pulled out from the socket 121, by hooking a finger on the latch member 133 and pulling the latch member 133, the cover plate 131 pivots on the shaft 132b of the hinge member 132, the front part of the socket 121 is opened, and the connector 14 is exposed through the socket 121.

Figure 10:
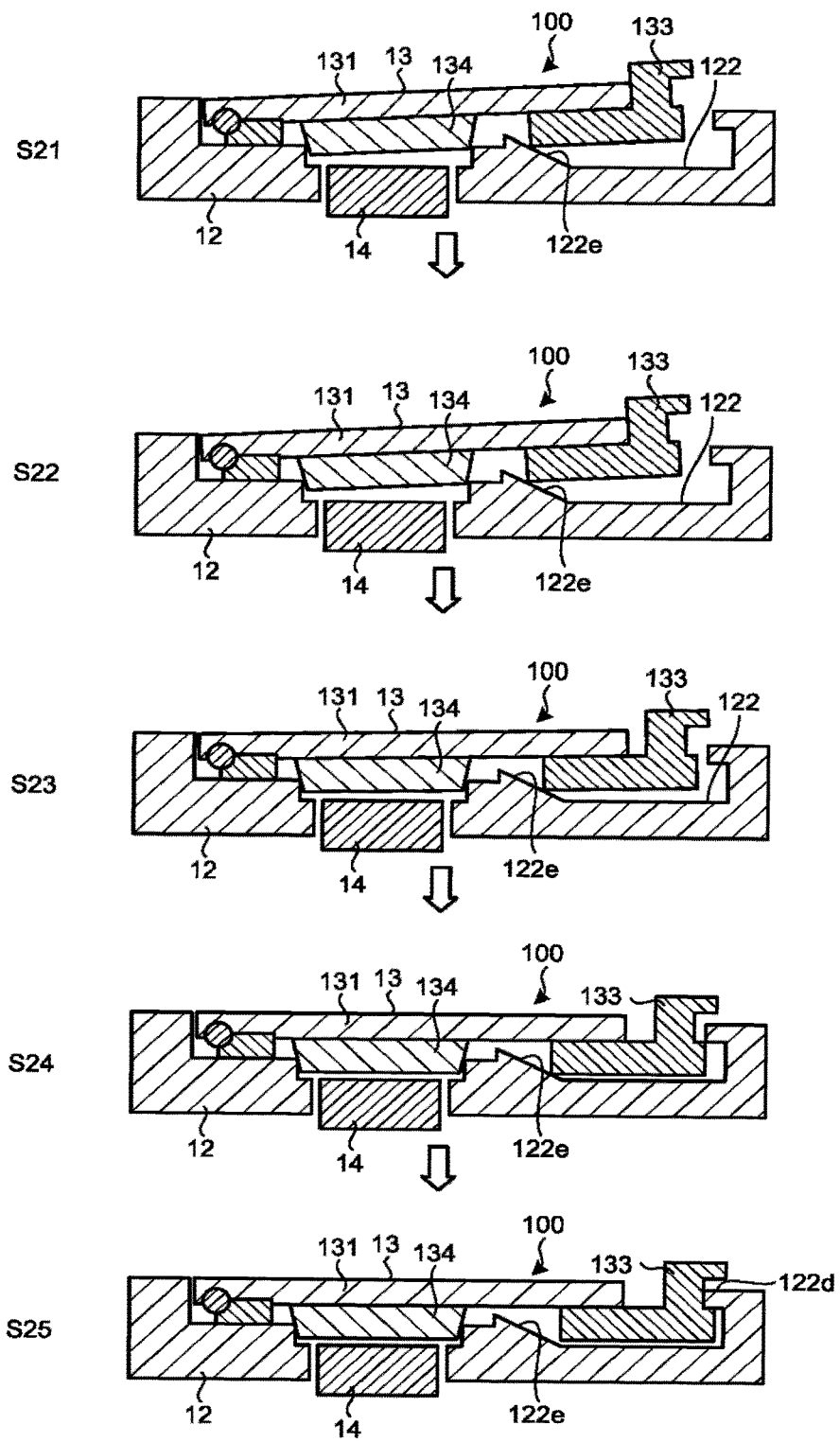
FIG. 10 is a view illustrating state changes that occur when the cover of the electronic device terminal protection structure according to the first embodiment is being closed.
Figure 11:
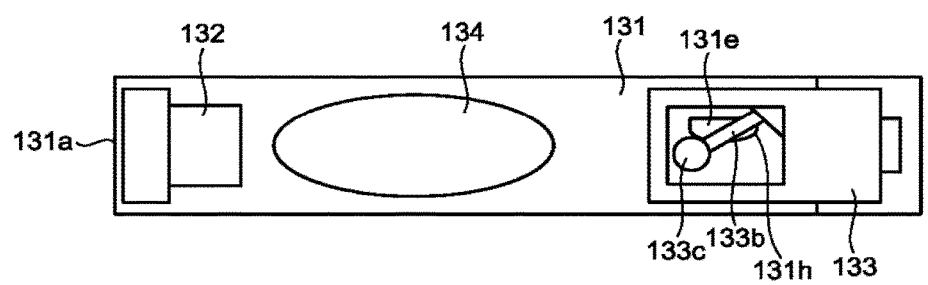
FIG. 11 is a view illustrating a state of the positioning mechanism of the electronic device terminal protection structure according to the first embodiment.

Next, the operation for closing the cover 13 will be described. FIG. 10 is a view illustrating state changes that occur when the cover of the electronic device terminal protection structure according to the first embodiment is being closed. When the cover plate 131 is pushed against the front panel 12 in the vicinity of the other end 131b as illustrated in stage S21, the latch member 133 is brought into contact with the guide slope 122e as illustrated in stage S22, and the latch member 133 slides down the guide slope 122e. FIG. 11 is a view illustrating a state of the positioning mechanism of the electronic device terminal protection structure according to the first embodiment. FIG. 11 illustrates how the positioning mechanism looks at the time that the latch member 133 begins to slide down the guide slope 122e. As illustrated in FIG. 11, at the time that the latch member 133 begins to slide down the guide slope 122e, the distal end 133c of the spring 133b abuts against the projection 131e from the side close to the one end 131a.

Figure 12:
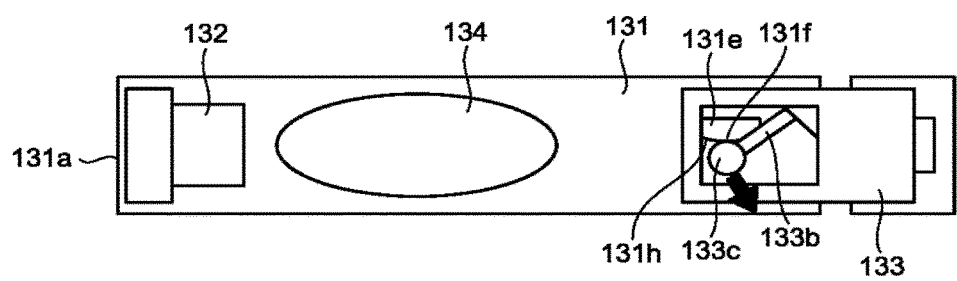
FIG. 12 is a view illustrating a state of the positioning mechanism of the electronic device terminal protection structure according to the first embodiment.

During the time the latch member 133 is sliding down the guide slope 122e, a force to insert the packing 134 into the socket 121 is applied from the cover plate 131, and the packing 134 is inserted into the socket 121 as illustrated in stage S23. Note that the fact that the cover plate 131 is movable in the groove 122 in the longitudinal direction and the width direction and that the wall 134a of the packing 134 is smaller than the cross section of the socket 121 at the distal end 134b and larger than the cross section of the socket 121 at the root 134c enables the packing 134 to be located at the same position as the socket 121 when the cover 13 is closed. FIG. 12 is a view illustrating a state of the positioning mechanism of the electronic device terminal protection structure according to the first embodiment. FIG. 12 illustrates how the positioning mechanism looks during the time the latch member 133 is sliding down the guide slope 122e. As illustrated in FIG. 12, during the time the latch member 133 is sliding down the guide slope 122e, the spring 133b is elastically deformed, and the distal end 133c of the spring 133b abuts against an apex 131f of the projection 131e.

Figure 13:
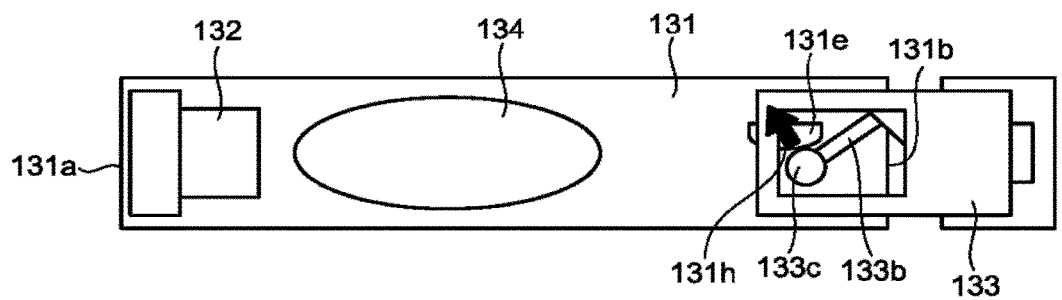
FIG. 13 is a view illustrating a state of the positioning mechanism of the electronic device terminal protection structure according to the first embodiment.

FIG. 13 is a view illustrating a state of the positioning mechanism of the electronic device terminal protection structure according to the first embodiment. FIG. 13 illustrates how the positioning mechanism looks at the time that the latch member 133 completes sliding down the guide slope 122e. When the latch member 133 completes sliding down the guide slope 122e as illustrated in stage S24, the distal end 133c abuts against the projection 131e from the side close to the other end 131b, with the spring 133b is kept being elastically deformed as illustrated in FIG. 13. Therefore, the distal end 133c of the spring 133b slides along the curved face of the projection 131e close to the other end 131b, and the spring 133b tries to be restored to its original shape. The spring 133b is restored to its original shape, so that the latch member 133 is led to and held in the lock position, and is engaged with the barb 122d as illustrated in stage S25. The above operation enables the cover 13 to be closed only by applying a force to push the cover plate 131 against the front panel 12.

Note that the engagement between the cover plate 131 and the front panel 12 can be realized by a snap-fit by providing a U-shaped structure having a spring property at the other end 131b of the cover plate 131. However, the cover 13 with the structure in which the snap-fit is provided on the cover plate 131 cannot be easily opened since a force to pull out the packing 134 from the socket 121 is not applied to the packing 134 when the cover 13 is disengaged from the front panel 12. In addition, the structure in which the snap-fit is provided on the cover plate 131 is liable to hinder miniaturization of the electronic device 10 since it is inevitable that the cover 13 is increased in thickness dimension due to the necessity of providing a spring property.

When opening the cover 13 of the electronic device terminal protection structure 100 according to the first embodiment, the packing 134 can be pulled out from the socket 121 simply by sliding the latch member 133 toward the unlock position. Therefore, the cover 13 can be easily opened when using the connector 14. Further, as compared with the structure in which the snap-fit is provided, the cover 13 can be reduced in thickness dimension and hardly hinders miniaturization of the electronic device 10.

In addition, when closing the cover 13 of the electronic device terminal protection structure 100 according to the first embodiment, the latch member 133 is guided by the guide slope 122e by applying a force to push the cover plate 131 against the front panel 12. Therefore, by merely applying a force to push the cover plate 131 against the front panel 12, the latch member 133 can be engaged with the barb 122d of the front panel 12, and the cover plate 131 can be prevented from being unexpectedly opened. Further, in the electronic device terminal protection structure 100 according to the first embodiment, the wall 134a of the packing 134 is inclined, and the cover plate 131 is movably held in the groove 122. Therefore, when closing the cover 13, the cover plate 131 moves through the groove 122 to automatically locate the packing 134 and the socket 121 in position. Therefore, it is possible to prevent the packing 134 and the socket 121 from being misaligned to deteriorate the waterproof performance.

Figure 14:
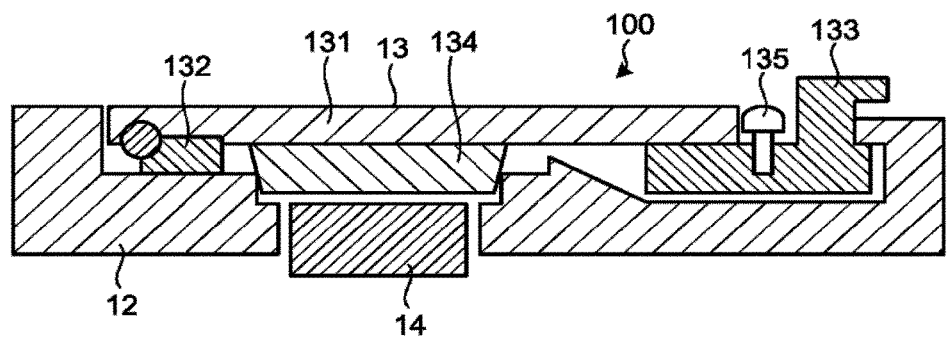
FIG. 14 is a cross-sectional view illustrating a modification of the electronic device terminal protection structure according to the first embodiment.

FIG. 14 is a cross-sectional view illustrating a modification of the electronic device terminal protection structure according to the first embodiment. A stopper 135 is attached to the latch member 133 arranged in the lock position. The stopper 135 interferes with the cover plate 131 when the latch member 133 is to be slid toward the unlock position, and the latch member 133 is prevented from being slid to the unlock position while the stopper 135 is attached. By providing the stopper 135, it is possible to prevent the latch member 133 from being unintentionally slid to the unlock position. In this example, the pin-shaped stopper 135 to be fit with the latch member 133 is illustrated. However, even with the stopper 135 having a block shape to be sandwiched between the latch member 133 and the cover plate 131, the effect of preventing the latch member 133 from being unintentionally slid to the unlock position can be obtained in the same way.

In the above description, the spring 133b is structured to be elastically deformed in parallel to the face of the cover plate 131. However, even with the spring 133b structured to be elastically deformed in the direction perpendicular to the face of the cover plate 131, the latch member 133 can be moved in the same way when the cover 13 is opened and closed. In the above description, the electronic device terminal arranged in the socket 121 is the connector 14. However, the electronic device terminal arranged in the socket 121 may be a slot. The slot arranged in the socket 121 may be exemplified by, but is not limited to, an SD memory card slot.

Second Embodiment

Figure 15:
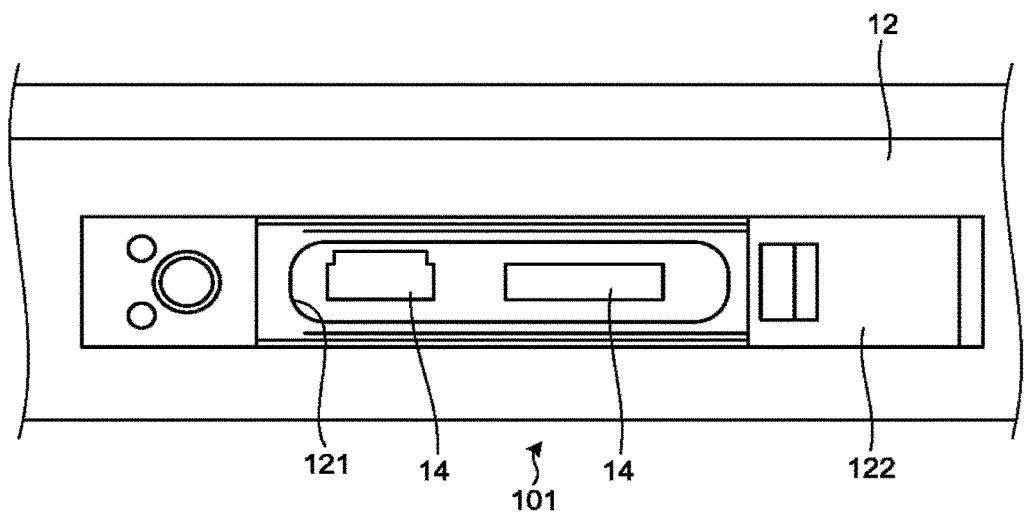
FIG. 15 is a view illustrating an electronic device terminal protection structure according to a second embodiment of the present invention.
Figure 16:
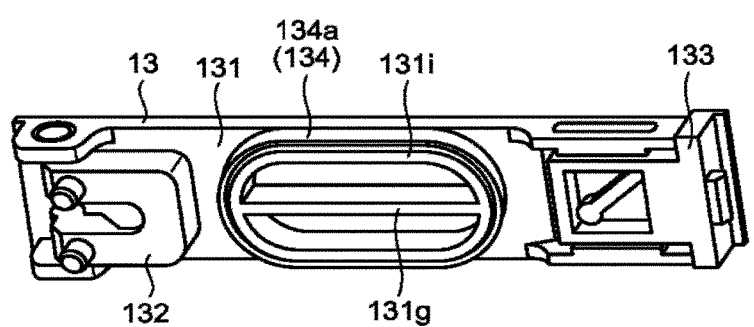
FIG. 16 is a perspective view illustrating the cover of the electronic device terminal protection structure according to the second embodiment.

FIG. 15 is a view illustrating an electronic device terminal protection structure according to a second embodiment of the present invention. In FIG. 15, the illustration of the cover 13 is omitted, and the groove 122 of the front panel 12 is illustrated. The electronic device terminal protection structure 101 according to the second embodiment is different from that of the first embodiment in that two connectors 14 are provided in the socket 121. FIG. 16 is a perspective view illustrating the cover of the electronic device terminal protection structure according to the second embodiment. In the second embodiment, only the wall 134a of the packing 134 is formed into a ring shape and is fit with a protrusion 131i of the cover plate 131. A rib 131g is provided on the protrusion 131i of the cover plate 131.

In the electronic device terminal protection structure 101 according to the second embodiment, since the two connectors 14 are surrounded by the single packing 134, the cover plate 131 is longer than the cover plate 131 of the first embodiment in which there is only one connector 14. If the cover plate 131 is simply lengthened, the rigidity of the central portion of the cover plate 131 becomes insufficient, and the cover plate 131 becomes liable to be bent. That is, the central portion of the cover plate 131 is deformed to lift up when the cover 13 is closed, which may hinder the packing 134 from being inserted into the socket 121 and deteriorate the waterproof performance.

In the electronic device terminal protection structure 101 according to the second embodiment, the rigidity of the center portion of the cover plate 131 is increased by providing the rib 131g on the cover plate 131. Therefore, the central portion of the cover plate 131 is prevented from being deformed to lift up when the cover 13 is closed. That is, it is possible to prevent the waterproof performance from being deteriorated.

In the structure described in the second embodiment, the two connectors 14 are arranged in the socket 121. However, in a case where it is desired to secure the rigidity of the cover plate 131 although only one connector 14 is arranged in the socket 121, the packing 134 may be formed into a ring shape, and the protrusion 131i including the rib 131g may be provided on the cover plate 131.

The electronic device terminal protection structure 101 according to the second embodiment can prevent the packing 134 from not being inserted into the socket 121 due to insufficient rigidity of the cover plate 131 and prevent the waterproof performance from being deteriorated.

The configuration described in the above-mentioned embodiments indicates an example of the contents of the present invention. The configuration can be combined with another well-known technique, and a part of the configuration can be omitted or changed in a range not departing from the gist of the present invention.

REFERENCE SIGNS LIST 10 electronic device; 11 rear case; 12 front panel; 13 cover; 14 connector; 15 display unit; 100, 101 electronic device terminal protection structure; 121 socket; 122 groove; 122a screw hole; 122b, 131a one end; 122c, 131b other end; 122d barb; 122e guide slope; 122f recess; 122g bottom face; 122h side face; 122i slope; 122j drain groove; 131 cover plate; 131c bearing; 131d latch guide projection; 131e, 132c projection; 131f apex; 131g, 133a rib; 131h curved face; 131i protrusion; 131j retaining projection; 132 hinge member; 132a plate portion; 132b shaft; 132d through hole; 133 latch member; 133b spring; 133c, 134b distal end; 134 packing; 134a wall; 134c root.

The invention claimed is:

1. An electronic device terminal protection structure comprising:
    a groove including a socket to expose an electronic device terminal to the outside; and
    a cover to cover the groove, wherein
    the cover includes:
    a cover plate having a plate shape;
    a hinge member provided at one end of the cover plate;
    a latch member, provided at another end of the cover plate, to perform a sliding operation; and
    a packing arranged on the cover plate to be inserted into the socket and abut against a side wall of the socket when the cover is closed, and
    the groove includes:
    a hinge fixing portion to which the hinge member is pivotably fixed;
    a barb that is engaged with the latch member; and
    a guide slope that leads the cover in a direction of pulling out the packing from the socket when the latch member abuts against the guide slope during a sliding operation performed in conjunction with disengagement of the latch member.

2. The electronic device terminal protection structure according to claim 1, wherein
    the latch member slides between an unlock position close to the one end of the cover plate and a lock position away from the one end of the cover plate,
    the barb is not engaged with the latch member arranged in the unlock position, and is engaged with the latch member arranged in the lock position, and
    in response to the latch member being arranged in the unlock position with the cover closed, the guide slope abuts against the latch member to urge the latch member in the direction of pulling out the packing from the socket, and when the cover is closed, the guide slope abuts against the latch member to lead the latch member to the lock position.

3. The electronic device terminal protection structure according to claim 2, wherein
    the cover plate and the latch member include a positioning mechanism to hold the latch member in the unlock position when the cover is opened, and to hold the latch member in the lock position when the cover is closed.

4. The electronic device terminal protection structure according to claim 3, wherein
    the positioning mechanism includes a projection formed on the cover plate and a spring having a rod shape and provided on the latch member,
    the projection includes a curved face whose intermediate portion in a longitudinal direction of the cover plate is convex, and
    a distal end of the spring abuts against the curved face from a side close to the one end, so that the latch member is held in the unlock position, and the distal end of the spring abuts against the curved face from a side close to the other end, so that the latch member is held in the lock position.

5. The electronic device terminal protection structure according to claim 1, wherein
    the hinge member includes a shaft pivotally supported by a bearing provided at the one end of the cover plate,
    the bearing includes an oval hole extending in a longitudinal direction of the cover plate, and
    the cover plate is movably supported in the groove in the longitudinal direction.

6. The electronic device terminal protection structure according to claim 1, wherein
    the latch member slides between an unlock position and a lock position,
    the cover plate and the latch member include a positioning mechanism that holds the latch member in the unlock position when the cover is opened, and holds the latch member in the lock position when the cover is closed,
    the positioning mechanism includes a projection formed on the cover plate and a spring having a rod shape and provided on the latch member, and
    a distal end of the spring abuts against the projection from a side close to the one end, so that the latch member is held in the unlock position, and the distal end of the spring abuts against the projection from a side close to the other end, so that the latch member is held in the lock position.

7. The electronic device terminal protection structure according to claim 6, wherein
    the projection includes a curved face whose intermediate portion in a longitudinal direction of the cover plate is convex.

8. An electronic device terminal protection structure comprising:
    a groove including a socket to expose an electronic device terminal to the outside; and
    a cover to cover the groove, wherein
    the cover includes:
    a cover plate having a plate shape;
    a hinge member provided at one end of the cover plate;
    a latch member, provided at another end of the cover plate, to perform a sliding operation; and
    a packing arranged on the cover plate to be inserted into the socket and abut against a side wall of the socket when the cover is closed, and
    the groove includes:
    a hinge fixing portion to which the hinge member is pivotably fixed;
    a barb that is engaged with the latch member; and
    a guide slope that leads the cover in a direction of pulling out the packing from the socket when the latch member abuts against the guide slope during a sliding operation performed in conjunction with disengagement of the latch member, wherein a positioning mechanism includes a projection formed on the cover plate and a spring having a rod shape and provided on the latch member, the projection includes a curved face whose intermediate portion in a longitudinal direction of the cover plate is convex, and a distal end of the spring abuts against the curved face from a side close to the one end, so that the latch member is held in an unlock position, and the distal end of the spring abuts against the curved face from a side close to the other end, so that the latch member is held in a lock position.

9. The electronic device terminal protection structure according to claim 1, wherein the packing includes a wall on a peripheral edge, a distal end of the wall has a shape smaller than a shape of a cross section of the socket, and a root of the wall has a shape larger than a shape of the cross section of the socket.

10. The electronic device terminal protection structure according to claim 8, wherein the packing includes a wall on a peripheral edge, a distal end of the wall has a shape smaller than a shape of a cross section of the socket, and a root of the wall has a shape larger than a shape of the cross section of the socket.

11. The electronic device terminal protection structure according to claim 1, wherein the packing is in a ring shape to be fit with a protrusion of the cover plate, and the cover plate includes a rib on the protrusion.

12. The electronic device terminal protection structure according to claim 8, wherein the packing is in a ring shape to be fit with a protrusion of the cover plate, and the cover plate includes a rib on the protrusion.

13. The electronic device terminal protection structure according to claim 11, wherein the socket exposes a plurality of the electronic device terminals to the outside.

14. The electronic device terminal protection structure according to claim 12, wherein the socket exposes a plurality of the electronic device terminals to the outside.

15. The electronic device terminal protection structure according to claim 1, wherein the groove includes a drain groove that guides water that has entered the groove toward an end including the barb.

16. The electronic device terminal protection structure according to claim 8, wherein the groove includes a drain groove that guides water that has entered the groove toward an end including the barb.

17. The electronic device terminal protection structure according to claim 1, wherein the groove includes a slope extending across a bottom face and a side face.

18. The electronic device terminal protection structure according to claim 8, wherein the groove includes a slope extending across a bottom face and a side face.

19. An electronic device comprising:

the electronic device terminal protection structure according to claim 1.

20. An electronic device comprising:

the electronic device terminal protection structure according to claim 8.

* * * * *